(12) United States Patent
Li et al.

(10) Patent No.: US 6,911,360 B2
(45) Date of Patent: Jun. 28, 2005

(54) FUSE AND METHOD FOR FORMING

(75) Inventors: Chi Nan Brian Li, Austin, TX (US); Alexander B. Hoefler, Austin, TX (US); Der-Gao Lin, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 11 days.

(21) Appl. No.: 10/425,275

(22) Filed: Apr. 29, 2003

(65) Prior Publication Data

US 2004/0217439 A1 Nov. 4, 2004

(51) Int. Cl.[7] .................................................. H01L 21/479
(52) U.S. Cl. ........................ 438/238; 438/281; 438/467; 257/379; 257/529
(58) Field of Search .............................. 438/132, 215, 438/238, 281, 467; 257/379, 529, 536, 537; 365/96

(56) References Cited

U.S. PATENT DOCUMENTS

| | | | | |
|---|---|---|---|---|
| 5,291,434 A | * | 3/1994 | Kowalski | 365/185.04 |
| 6,229,733 B1 | * | 5/2001 | Male | 365/185.18 |
| 6,258,700 B1 | | 7/2001 | Bohr et al. | |
| 6,420,217 B1 | * | 7/2002 | Kalnitsky et al. | 438/132 |
| 2002/0105050 A1 | * | 8/2002 | Hagiwara et al. | 257/529 |

OTHER PUBLICATIONS

Stanley Wolf, "Silicon Processing for the VLSI Era—vol. 2: Process Integration," Lattice Press, Sunset Beach, California (1990), pp. 354–356.*

Stanley Wolf and Richard N. Tauber, "Silicon Processing for the VLSI Era—vol. 1: Process Technology," Lattice Press, Sunset Beach, California (1986), pp. 397–399.*

* cited by examiner

*Primary Examiner*—Stephen W. Smoot
(74) *Attorney, Agent, or Firm*—Joanna G. Chiu; Michael J. Balconi-Lamica

(57) ABSTRACT

An active fuse includes an active fuse geometry (120) that is used to form both a variable resistor (106) and a select transistor (110). In one embodiment, the active fuse geometry is formed in a portion of an active region (160) of a semiconductor substrate (140), and a select gate (124) is disposed over an end portion (123) of the active fuse geometry to form an integral select transistor (110) for use in programming the active fuse. The use of a shared active fuse geometry within the active region allows for reduced area requirements and improved sensing margins.

37 Claims, 3 Drawing Sheets

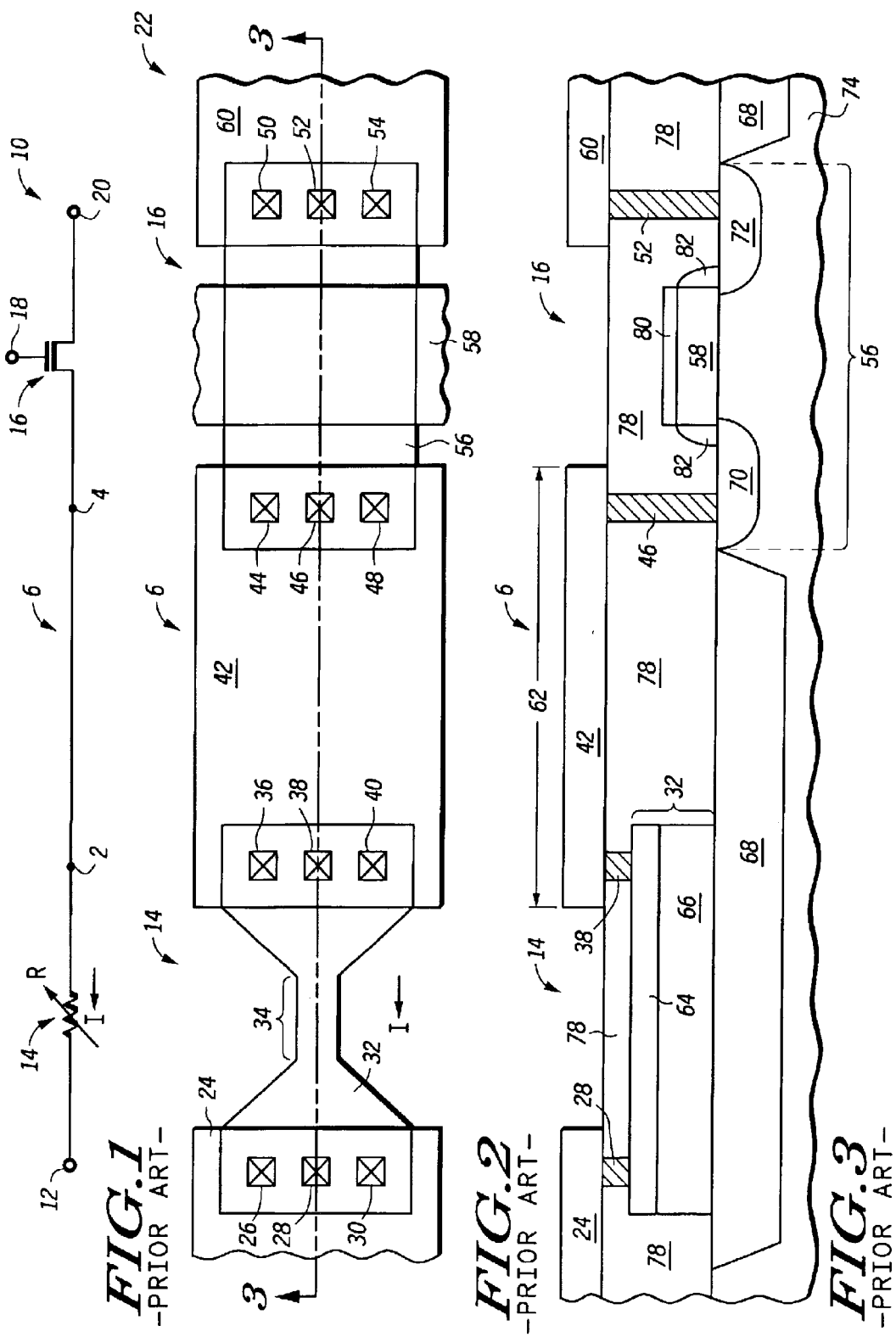

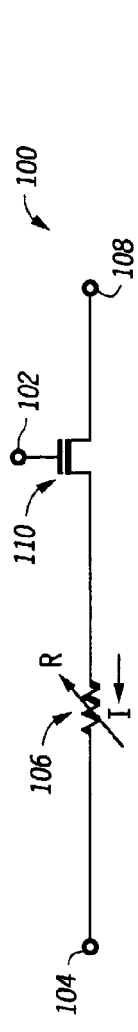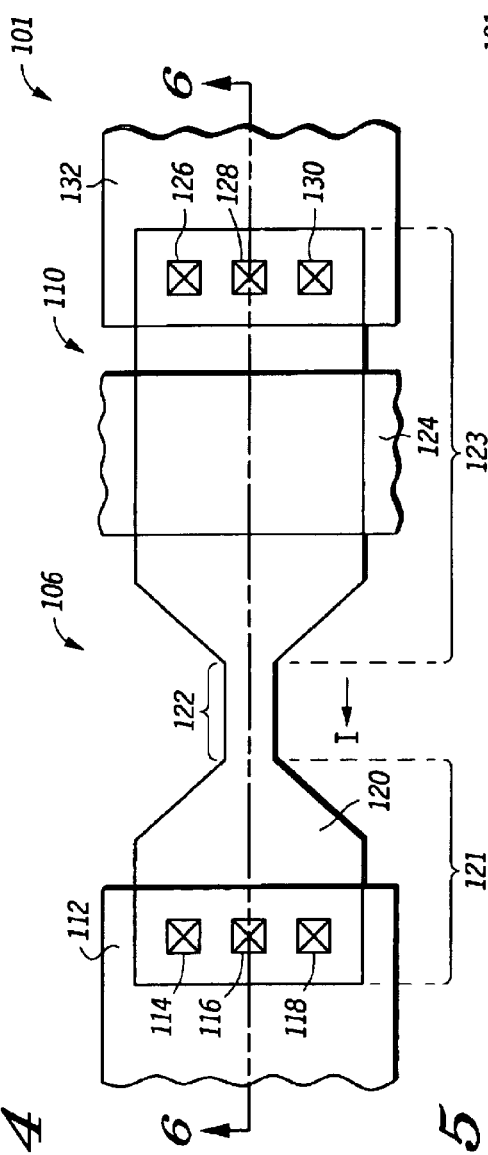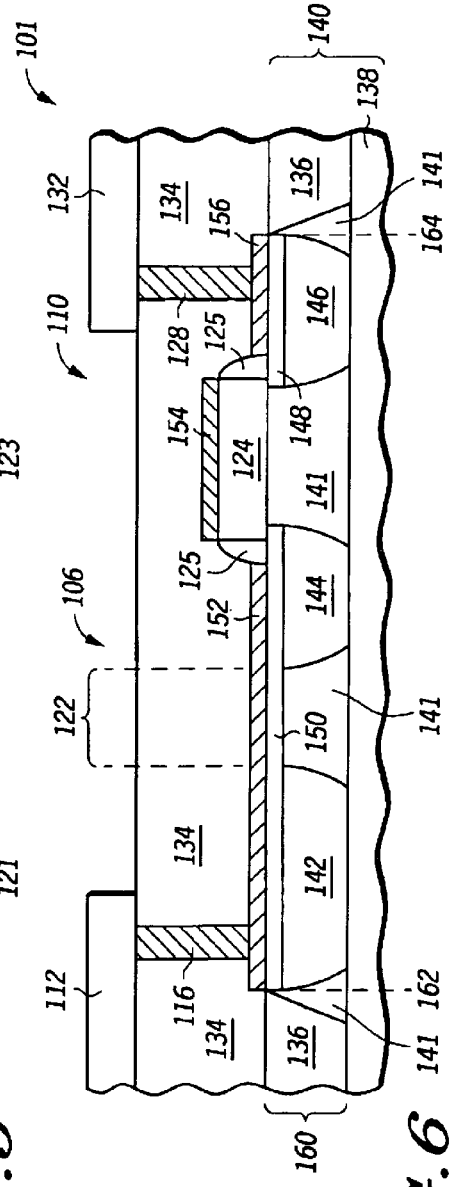
FIG.4
FIG.5
FIG.6

FUSE AND METHOD FOR FORMING

FIELD OF THE INVENTION

The present invention relates generally to fuses, and more specifically, to active fuses.

RELATED ART

In integrated circuits, fuses are often used to store permanent information or form permanent connections. For example, fuses may be used to fix incorrect circuit connections and replace defective elements, such as in memory redundancy applications. Also, fuses are commonly used for chip identification or in the implementation of security features. Fuses may also be used for analog trimming. Fuses may also be used as one time programmable (OTP) elements used to replace read only memories (ROM) that can be programmed once the chip is in packaged form.

One type of fuse available today is a polysilicon fuse, as will be discussed in reference to FIGS. 1–3. FIG. 1 illustrates a schematic 10 illustrating a polysilicon fuse 14 (also referred to as variable resistor 14) in combination with a driving transistor 16, coupled between nodes 12 and 20 (where a control electrode of transistor 16 is coupled to a node 18). Transistor 16 and variable resistor 14 are coupled to each other via a metal portion 6. The metal portion 6 provides an interconnect between variable resistor 14 at node 2 and driving transistor 16 at node 4. Initially, variable resistor 14 has a low resistance. However, if desired, variable resistor 14 may be programmed to have a high resistance by driving a current (e.g. labeled "I" on FIG. 1) through variable resistor 14 from driving transistor 16 which permanently damages variable resistor 14, thus resulting in a higher resistance. Therefore, variable resistor 14 may have a low or a high resistance, as desired, corresponding to two states of a fuse. However, the resistance ratio of high resistance to low resistance is generally low and thus difficult to sense.

FIG. 2 illustrates a top-down view of a device 22 corresponding to schematic 10 of FIG. 1. Device 22 includes a polysilicon portion 32 which has wider portions at each end, and a center portion 34 that is narrower than the end portions. The center portion 34 corresponds to variable resistor 14. Note that polysilicon portion 32 also includes an overlying silicide portion, as will be seen in reference to FIG. 3. Device 22 also includes an active region 56 and a gate 58 used to form driving transistor 16. Note that in order to couple driving transistor 16 to polysilicon fuse 14, a metal portion 42, corresponding to metal portion 6 of FIG. 1, is needed to provide the proper electrical connection. Device 22 includes contacts 26, 28, and 30 to provide an electrical connection to a metal portion 24, corresponding to node 12 of FIG. 1, and contacts 50, 52, and 54 to provide an electrical connection to a metal portion 60, corresponding to node 20 of FIG. 1. Device 22 also includes contacts 36, 38, and 40 to provide an electrical connection between polysilicon portion 32 and metal portion 42, and contacts 44, 46, and 48 to provide an electrical connection between active region 56 and metal portion 42. Note that metal portion 42 between variable resistor 14 and driving transistor 16 must be sufficiently wide to support the large current (e.g. labeled "I" on FIG. 2) from driving transistor 16 provided to variable resistor 14 necessary to program the fuse. Also, as will be further discussed in reference to FIG. 3, physical design rules must be adhered to in forming metal portion 42 to interconnect variable resistor 14 and driving transistor 16.

FIG. 3 illustrates a cross-sectional view of device 22. FIG. 3 illustrates a substrate 74 having field oxide regions 68, 70, and 72, as known in the art. Variable resistor 14 has a polysilicon layer 66 overlying field oxide region 68, and a silicide layer 64 overlying polysilicon layer 66. Note that silicide layer 64 and polysilicon layer 66 correspond to polysilicon portion 32 of FIG. 2. Therefore, prior to programming variable resistor 14, the resistance of variable resistor 14 is low due to the presence of silicide layer 64 between contacts 28 and 38. However, to program variable resistor 14, a sufficiently large current (from driving transistor 16) is forced through silicide layer 64 and polysilicon layer 66, such that the current through silicide layer 64 (which has a lower resistance than polysilicon layer 66) is destroyed. For example, as a result of the large current, silicide layer 64 may become discontinuous through agglomeration, thus resulting in increased resistance. Alternatively, as a result of the large current, electromigration may result in voids within silicide layer 64, thus also resulting in increased resistance. Generally, polysilicon layer 66 is about 3 times thicker than silicide layer 64.

FIG. 3 also illustrates an example of driving transistor 16 which may be formed within substrate 74. Driving transistor 16 includes gate 58 overlying substrate 74. Also, note that transistor 16 also includes a gate oxide layer between gate 58 and substrate 74 (not shown). Note that driving transistor 16 may be formed as known to one skilled in the art and may be any suitable type of transistor, and therefore, will not be discussed in more detail here. Metal portion 42 overlies a dielectric layer 78, between variable resistor 14 and driving transistor 16 and electrically connected to each by contact 38 and contact 46, respectively. Note that metal portion 42 must have a sufficiently long distance 62 to accommodate the physical design rules that must be adhered to in forming variable resistor 14 and driving transistor 16. These physical design rules dictate, for example, the spacing required between contact 38 and contact 46, the length of underlying field oxide 68, the distance between contact 38 and the edge of silicide layer 64 and polysilicon layer 66, etc. Also, the physical design rules dictate a minimum length for length 62 for metal portion 42 to provide the proper electrical connection between variable resistor 14 and driving transistor 16.

Therefore, variable resistor 14 and driving transistor 16, both required for implementing the polysilicon fuse, have large area requirements, thus limiting the number of fuses that can be used and their location. Also, the resistance ratio prior to and after programming variable resistor 14 is generally low due to the thickness of polysilicon layer 66. This results in a lower sensing margin for the fuse. Therefore, a need exists for an improved fuse which requires less area and has a higher sensing margin.

BRIEF DESCRIPTION OF THE DRAWINGS

The present invention is illustrated by way of example and not limited by the accompanying figures, in which like references indicate similar elements, and in which:

FIGS. 1–3 illustrates various views of a polysilicon fuse and a driving transistor, as known in the art;

FIG. 4 illustrate, in schematic form, a variable resistor and select transistor in accordance with one embodiment of the present invention;

FIG. 5 illustrates a top-down layout view of the variable resistor and select transistor of FIG. 4, in accordance with one embodiment of the present invention;

FIG. 6 illustrates a cross-sectional view of the variable resistor and select transistor of FIGS. 4 and 5, in accordance with one embodiment of the present invention;

Figure 7:
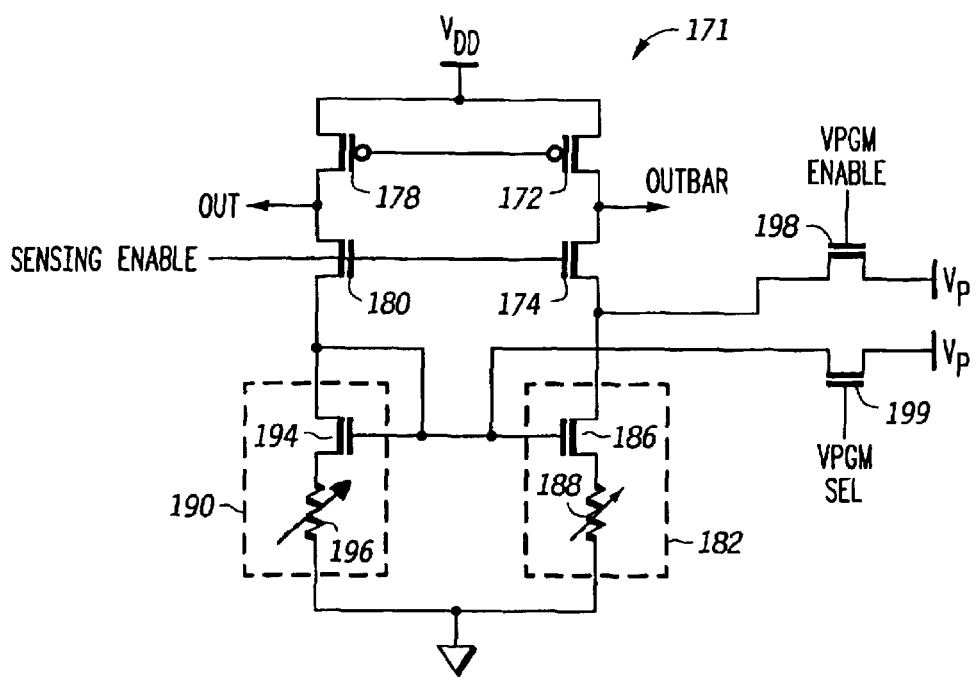
FIG. 7 illustrates, in schematic form, a sense amplifier in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

One embodiment disclosed herein relates to an active fuse in which an active fuse geometry is used to form both a variable resistor and a select transistor. In one embodiment, the active fuse geometry is formed in a portion of an active region of a semiconductor substrate, and a select gate is disposed over an end portion of the active fuse geometry to form an integral select transistor for use in programming the active fuse. The use of a shared active fuse geometry within the active region allows for reduced area requirements and improved sensing margins.

FIG. 4 illustrates a schematic diagram of a device 100 which includes an active fuse implemented as a variable resistor 106 and a select transistor 110. Therefore, note that variable resistor 106 may also be referred to as fuse 106 or active fuse 106. (Also, note that the term fuse or active fuse may be used to refer to the combination of variable resistor 106 and select transistor 110.) Device 100 includes variable resistor 106 having a first terminal coupled to a node 104 and a second terminal coupled to a first current electrode of select transistor 110. Select transistor 110 includes a second current electrode coupled to a node 108 and has a control electrode coupled to node 102. Note, as will be discussed further in reference to FIGS. 5 and 6 below, no additional metal portion is needed to electrically connect the second terminal of variable resistor 106 to the first current electrode of select transistor 110. Also, while select transistor 110 is illustrated as an N-type transistor, alternate embodiments may use a P-type transistor as select transistor 110.

Initially, variable resistor 106 has a low resistance corresponding to a first resistance state of the active fuse. However, if desired, variable resistor 106 may be programmed to have a high resistance, corresponding to a second resistance state of the active fuse. Variable resistor 106 may be programmed by driving a current (e.g. labeled "I" on FIG. 4) through variable resistor 106 from select transistor 110 which permanently damages variable resistor 106, thus resulting in the higher resistance. Therefore, variable resistor 106 may have a low or a high resistance, as desired, corresponding to two resistance states of the active fuse (where, for example, one of the two resistance states may correspond to a logic one and another one of the two resistance states may correspond to a logic zero). Also, as will be discussed in more detail in reference to FIGS. 5 and 6 below, variable resistor 106 is formed using an active region of device 100 rather than a polysilicon region. This allows for a reduction in area required by device 100 and an improved resistance ratio for a greater sensing margin.

FIG. 5 illustrates a top-down view of a device 101 corresponding to device 100 of FIG. 4. Device 101 includes an active fuse geometry 120 which is used to form both variable resistor 106 and select transistor 110. Active fuse geometry 120 includes three portions 121, 122, and 123. Portion 122 is a narrower, resistor portion located between portions 121 and 123 used to form an active resistor structure (e.g. variable resistor 106). Generally, portions 121 and 123 are wider as compared to resistor portion 122. (Although not shown, active fuse geometry 120 may also include an overlying silicide portion, as will be shown in FIG. 6.) Portion 121 includes contacts 114, 116, and 118 which provides an electrical connection between portion 121 and a metal portion 112, corresponding to node 104 of FIG. 4. Portion 123 includes a select gate portion 124 overlying a portion of portion 123 to form select transistor 110 and contacts 126, 128, and 130 to provide an electrical connection between portion 123 (corresponding to the second current electrode of transistor 110) and a metal portion 132 (corresponding to node 108 of FIG. 4). Note that the illustrated embodiment includes three contacts to form each electrical connection (e.g. 114, 116, and 118 or 126, 128, and 130); however, note that alternate embodiments may use any number and shape of contacts to provide the electrical connections. Also, note that additional contacts may also be used, as necessary. For example, an additional contact or contacts may be located between portion 122 and select gate 124 to provide an electrical contact to the first current electrode of transistor 110, if desired. A contact (not shown) to select gate 124 may also be present for providing an electrical connection to the control electrode of select transistor 110, corresponding to node 102 of FIG. 4.

As will be described in more detail in reference to FIG. 6 below, active fuse geometry 120 is formed from an active region of device 101. This allows the active fuse geometry to be used for forming both variable resistor 106 and select transistor 110. This prevents the need for an additional metal connection between the second terminal of variable resistor 106 and the first current electrode of select transistor 110, thus reducing the area requirements. Therefore, unlike prior art polysilicon fuses as described above in reference to FIGS. 1–3, an additional metal interconnect between a polysilicon resistor portion and an active region transistor portion is not necessary. Furthermore, since the additional metal interconnect is not needed, contacts between variable resistance 106 and select transistors 110 are also not needed, which allows for further area savings. Also, since the active region of device 101 is used to form active geometry 120, an additional field oxide region below the variable resistor is no longer necessary. These savings in area also contribute to a savings in processing complexity and cost.

FIG. 6 illustrates a cross-sectional view of device 101 (which also corresponds to device 100). Device 101 includes a substrate 140 which includes an active layer 160 overlying an insulator layer 138. Therefore, in the illustrated embodiment, note that substrate 140 is a silicon-on-insulator (SOI) substrate. However, note that in alternate embodiments, any substrate may be used, such as a bulk silicon substrate, a gallium arsenide substrate, or the like, having an active region such as active layer 160. Active layer 160 includes doped regions 142, 144, and 146 within a well 141 of opposite polarity type. For example, in the illustrated embodiment, doped regions 142, 144, and 146 are N-type doped regions and well 141 is a P-type well in order to implement select transistor 110 as an N-type transistor. Active layer 160 also includes field oxide regions 136 on either side of doped regions 142 and 146. Doped regions 144 and 146 correspond to source/drain regions of transistor 110. Transistor 110 also includes gate 124 overlying substrate 140 such that a channel region is formed beneath gate 124 between doped regions 144 and 146, as known in the art. Note also that transistor 110 includes a gate oxide (not shown) between gate 124 and substrate 140, as known in the art. Transistor 110 may also include sidewall spacers 125 on both sides of gate 124, overlying doped regions 144 and 146. Gate 124 can be any type of transistor gate, such as, for example, a polysilicon gate, a metal gate, or any other appropriate gate or gate stack. Transistor 110 may also include extension regions 150 and 148; however, they are optional. If present, extension regions 150 and 148 are generally shallow doped regions of the same conductivity type as doped regions 144 and 146 (which may also be referred to as deep implant regions). For example, in the illustrated embodiment, extension regions 150 and 148 are N-type extension regions.

Although the illustrated embodiment implements transistor 110 as an N-type transistor, alternate embodiments may use a P-type transistor. Alternatively, transistor 110 may be any type of transistor as known in the art, and may be formed in any appropriate way, as known in the art. Furthermore, transistor 110 and variable resistor 106 may be formed using known processes and materials. Similarly, active layer 160 may be formed any way as known in the art to form active fuse geometry 120. Also, note that any shape may be used to form active fuse geometry 120. For example, a ring structure may be used to form select transistor 110 or a finger structure may be used where active fuse geometry 120 may include a plurality of fingers coupled to form select transistor 110. Therefore, any shape or size active area may be used to form a variable resistor and select transistor from a same active fuse geometry.

As mentioned above, active layer 160 also includes doped region 142 (also referred to as a deep implant region) which provides an electrical contact from metal portion 112 to active layer 160. In the illustrated embodiment, doped region 142 is also an N-type region since well 141 is a P-type well. The area between doped regions 142 and 144 corresponds to resistor region 122 of variable resistor 106. If present, extension region 150 extends along the top of active layer 160 over both doped regions 144 and 142. Device 101 also includes a silicide layer 152 formed over extension region 150 (if present) or over active layer 160 if extension region 150 is not present. Device 101 also includes a silicide layer 154 overlying gate 124 and silicide region 156 overlying doped region 146 and extension region 148, if present. Silicide region 156 provides an electrical connection to metal portion 132 via contact 128 (and contacts 126 and 130). Similarly, silicide layer 152 provides an electrical connection to metal portion 112 via contact 116 (and contacts 114 and 118). Device 101 also includes a dielectric layer 134 overlying transistor 110 and variable resistor 106, and metal portions 112 and 132 overlying dielectric layer 134. Note that the portion of active layer 160 between dotted lines 162 and 164 correspond generally to active fuse geometry 120 of FIG. 5.

As discussed above, to program variable resistor 106, a current (e.g. labeled "I" on FIGS. 4 and 5) sufficiently large to destroy silicide layer 152 is provided by select transistor 110. The resistor portion 122, being narrower than end portion 123, increases the current density of current from select transistor 110 which affects silicide layer 152. For example, as a result of the large current and increased current density through resistor portion 122, silicide layer 152 may become discontinuous through agglomeration, thus resulting in increased resistance. Alternatively, as a result of the large current, electromigration may result in voids within silicide layer 152, thus also resulting in increased resistance. In one embodiment, note that the thickness of silicide 152 is about the same as the thickness of extension region 150. This results in an improved resistance ratio. That is, the ratio of the high resistance (the resistance of region 122 after programming) to the low resistance (the resistance of region 122 prior to programming) is higher as compared to the ratio allowed by the polysilicon fuse described above. Alternatively, extension region 150 may not be present, or may at least not be present in region 122, which results in even a higher ratio of the high resistance to the low resistance. In one embodiment, the resistance ratio of high resistance to low resistance is at least 10. Preferably, the resistance ratio is at least 20, and more preferably, at least 30. Therefore, embodiments of the active fuse discussed herein allow for an improved sensing margin while achieving a reduced area requirement.

FIG. 7 illustrates one embodiment of an integrated circuit using an active fuse as described above in reference to FIGS. 4–6. The integrated circuit includes a sense amplifier 171 capable of using device 101 for improved performance and area requirements. Sense amplifier 171 includes N-type transistors 180, 174, 194, 186, 198, and 199, P-type transistors 178 and 172, resistor 196, and variable resistor 188. Sense amplifier 171 includes a p-type transistor 178 having a first current electrode coupled to a first voltage supply (e.g. Vdd), and a second current electrode coupled to a first current electrode of an n-type transistor 180. N-type transistor 180 includes a second current electrode coupled to a first terminal of N-type transistor 194. N-type transistor 194 includes a second current electrode coupled to a first terminal of a resistor 196, and resistor 196 has a second terminal coupled to a reference voltage (i.e. ground). Sense amplifier 171 also includes a p-type transistor 172 having a first current electrode coupled to the first voltage supply, and a second current electrode coupled to a first current electrode of an n-types transistor 174. N-type transistor 174 includes a second current electrode coupled to a first terminal of N-type transistor 186. N-type transistor 186 includes a second current electrode coupled to a first terminal of a variable resistor 188, and variable resistor 188 has a second terminal coupled to the reference voltage. A control electrode of P-type transistor 178 is coupled to a control electrode of P-type transistor 172. A sensing enable signal is coupled to control electrodes of N-type transistors 180 and 174. A control electrode of N-type transistor 194 is coupled to a control electrode of N-type transistor 186. The control electrode of N-type transistor 194 is coupled to the first current electrode of N-type transistor 194, and the control electrode of N-type transistor 186 is coupled to the first current electrode of N-type transistor 186. N-type transistor 198 has a first current electrode coupled to the second current electrode of N-type transistor 174, a second current electrode coupled to a program voltage (Vp), and a control electrode coupled to receive Vpgm enable. N-type transistor 199 has a first current electrode coupled to the control electrode of N-type transistor 186, a second current electrode coupled to Vp, and a control electrode coupled to receive Vpgm sel. The second current electrodes of P-type transistors 178 and 172 provide the output of sense amplifier 171, out and outbar, respectively. Also, note that in alternate embodiments, Vp may be the same as Vdd. Alternatively, Vp may be a different value than Vdd, or in yet another embodiment, the Vp for the second current electrode of transistor 198 may be a different value than the Vp for the second current electrode of transistor 199.

Note that transistor 194 and variable resistor 196 can be implemented as an active fuse device such that device 190 can be implemented with device 101 of FIGS. 5 and 6. Similarly, note that transistor 186 and variable resistor 188 can also be implemented as an active fuse device such that device 182 can be implemented with device 101 of FIGS. 5 and 6. Therefore, sense amplifier 171 may take up less area while providing an improved sensing margin.

In operation, sense amplifier 171 may be programmed by programming variable resistor 188 as discussed above with reference to FIGS. 4–6. That is, Vpgm enable (to enable programming) and Vpgm sel (to select the current cell) may both be asserted such that each of the first current electrode and control electrode of N-type transistor 186 is set to the first voltage supply so as to turn on N-type transistor 186 which drives a current through variable resistor 188, thus changing the resistance of variable resistor 188 from a low resistance to a high resistance (such as by destroying the silicide region of variable resistor 188). Note that variable resistor 196 is maintained at the low resistance state. That is, it is not programmed to the high resistance state, and it operates as a reference cell. Once programmed, the programmed value may be read or sensed by asserting sensing enable (while Vpgm enable and Vpgm sel remain unasserted) which activates N-type transistors 180 and 174 such that currents are provided to out and outbar. These currents are then used to determine the value stored in sense amplifier 171. For example, if variable resistor 188 is programmed to a high resistance, out and outbar would provide first predetermined values, and if variable resistor 188 remains at a low resistance (i.e. it is not programmed), out and outbar would provide second predetermined values. The first predetermined value can correspond to a first state stored within sense amplifier 171 and the second predetermined value can correspond to a second state stored within sense amplifier 171. In one embodiment, the first predetermined value can correspond to one of a logic level zero or one and the second predetermined value can correspond to the other one of a logic level zero or one.

Since transistor 186 and variable resistor 188 can share a same active region and transistor 194 and variable resistor 196 can also share a same active region, the area required to form sense amplifier 171 within integrated circuit 170 can be greatly reduced. Also, due to the increased resistance ratio between the high and low resistance states, the sense margin of sense amplifier 171 is improved, thus resulting in improved sensing speed and performance. Also note that in alternate embodiments, a variety of different sense amplifier designs may be used.

Figure 8:
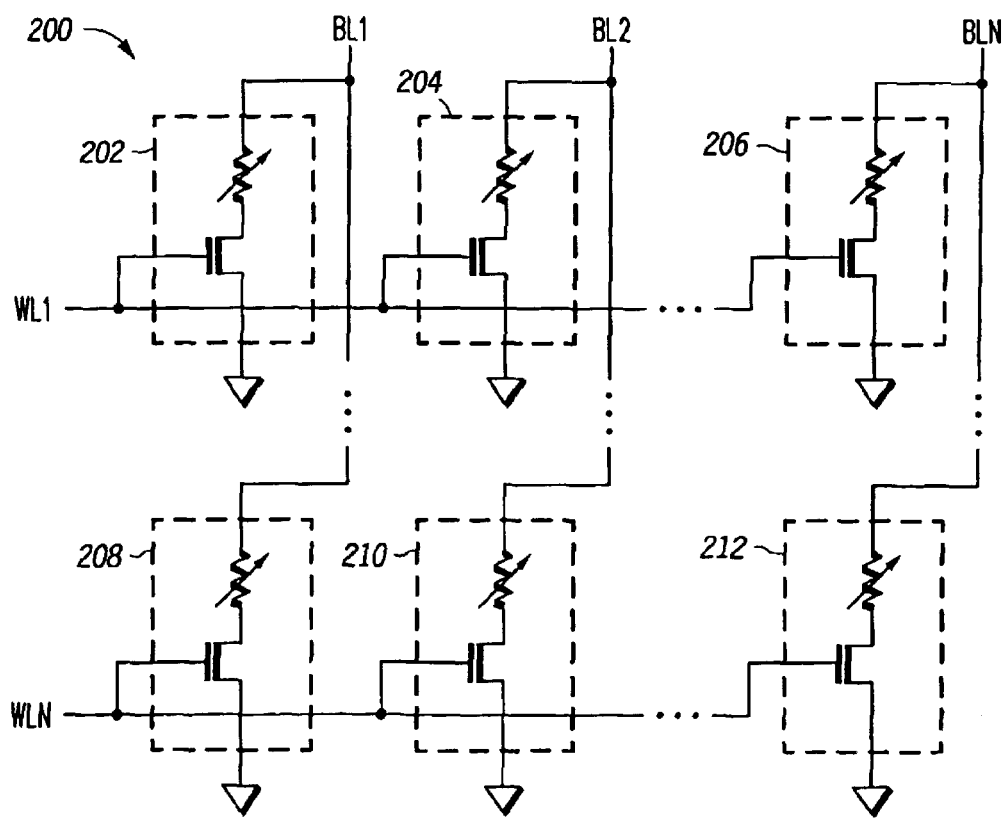
FIG. 8 illustrates, in schematic form, a memory array in accordance with one embodiment of the present invention.

FIG. 8 illustrates a portion of a memory array 200 according to one embodiment of the present invention. Memory array 200 includes a plurality of memory cells 202, 204, 206, 208, 210, and 212 which may be used to form a nonvolatile memory array. That is, each of the cells has the ability to be programmed once. Therefore, a low resistance state (i.e. not programmed) may correspond to a first logic state of the memory cell and a high resistance state (i.e. programmed) may correspond to a second logic state of the memory cell. For example, in order to program a memory cell, such as, for example, memory cell 204, periphery circuitry (not shown) may be used to assert a first word line (WL1) and a second bitline (BL2) such that a current is forced through the variable resistor of memory cell 204, thus resulting in a high resistance state. Any memory cell that needs to be programmed with a high resistance state can therefore be programmed as such. Also, the periphery circuitry (not shown) may then be used to sense the values within the memory cells, as needed, by selecting appropriate wordlines and bitlines, as known in the art. Therefore, through the use of a device such as device 101 of FIGS. 5 and 6 to implement each of the memory cells, the area required by the overall memory array is reduced, and improved sensing performance and speed is achieved due to the higher resistance ratio. Note also that memory array 200 may include any number of memory cells, bitlines, and word lines, as needed. Also memory array 200 may be any type of memory.

Therefore, it can be appreciated how the use of an active fuse geometry which may be shared by both a variable resistor and a select transistor can reduce the area required and improve sense margins. For example, the active fuse described herein may be used in a variety of applications, such as in memory arrays, sense amplifiers, or any time information needs to be permanently stored on an integrated circuit, or in any application requiring OTP elements.

Although the invention has been described with respect to specific conductivity types or polarity of potentials, skilled artisans appreciated that conductivity types and polarities of potentials may be reversed. For example, although the embodiments herein have been described in reference to an N-type transistor sharing an active area with a variable resistor to form an active fuse, it can be appreciated that in alternate embodiments, a P-type transistor may share an active area with a variable resistor to form an active fuse, depending on the application of the active fuse. Also, in the embodiments described above, programming the active fuse referred to changing the state of the variable resistor from a low resistance to a high resistance. However, in alternate embodiments, programming may refer to changing the fuse from one resistance state to another resistance state.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a fuse, comprising:
   forming a fuse geometry in a portion of an active region, wherein the fuse geometry includes opposite end portions and a middle portion; and
   forming a select gate disposed over an end portion of the fuse geometry, wherein the select gate and an underlying portion of the end portion of the fuse geometry form an integral select transistor for use in programming the fuse, wherein during programming, a current is driven from the select transistor through the middle portion of the fuse geometry, and wherein the current driven from the select transistor through the middle portion of the fuse geometry damages a portion of a silicide over the middle portion of the fuse geometry to change a resistance of the active region.

2. The method of claim 1, wherein the middle portion of the fuse geometry is adapted to increase a current density of a current through an end portion of the fuse geometry sufficient for fuse programming.

3. The method of claim 1, wherein the middle portion forms an active resistor structure.

4. The method of claim 1, wherein the active region includes a shallow doping layer.

5. The method of claim 1, wherein the active region includes deep implants.

6. The method of claim 1, further comprising:
forming sidewall spacers around the select gate.

7. The method of claim 1, further comprising:
forming a silicide over the select gate and portions of the fuse geometry.

8. The method of claim 7, wherein the silicide is an active silicide over the portions of the fuse geometry.

9. The method of claim 1, further comprising:
forming a contact proximate the select gate within an end portion of the fuse geometry.

10. The method of claim 9, wherein the contact includes multiple contact regions configured to handle a current flow sufficient to program the fuse.

11. The method of claim 1, further comprising:
forming a contact with an end portion of the fuse geometry.

12. The method of claim 1, further comprising:
forming first and second contacts in contact with an end portion of the fuse geometry proximate the select gate and in contact with an opposite end portion of the fuse geometry, respectively.

13. The method of claim 12, wherein one selected from the group consisting of the first and second contacts includes multiple contact regions configured to handle an increased current flow more than a current flow through a single contact.

14. The method of claim 1, wherein the active region includes one selected from the group consisting of an active region of a bulk silicon substrate and an active region of an SOI substrate.

15. The method of claim 1, further comprising:
programming the fuse according to a desired fuse state using the select transistor.

16. The method of claim 15, wherein programming of the fuse includes changing a middle portion of the fuse geometry from a first resistance state to a second resistance state.

17. The method of claim 1, further comprising:
combining the fuse with sensing circuitry of a memory array; and
programming the fuse according to a desired fuse state using the select transistor.

18. The method of claim 17, wherein programming of the fuse includes changing a middle portion of the fuse geometry from a first resistance state to a second resistance state.

19. A method of making a fuse, comprising:
forming a fuse geometry in a portion of an active region, wherein the fuse geometry includes opposite end portions and a middle portion, wherein the middle portion forms an active resistor structure;
forming a select gate disposed over an end portion of the fuse geometry, wherein the select gate and an underlying portion of the end portion of the fuse geometry form an integral select transistor for use in programming the fuse;
forming a silicide over the select gate and portions of the fuse geometry;
forming first and second contacts, the first contact with an end portion of the fuse geometry proximate the select gate and the second contact with an opposite end portion of the fuse geometry; and
programming the fuse according to a desired fuse state using the select transistor and a programming current via first and second contacts, wherein the programming current damages a portion of the silicide over the middle portion of the fuse geometry to change a resistance of the active resistor structure.

20. A fuse, comprising:
a fuse geometry in a portion of an active region, wherein the fuse geometry includes opposite end portions and a middle portion; and
a select gate disposed over an end portion of the fuse geometry, wherein the select gate and an underlying portion of the end portion of the fuse geometry form an integral select transistor for use in programming said fuse, wherein during programming, a current is driven from the select transistor through the middle portion of the fuse geometry damaging a portion of a silicide formed over the middle portion of the fuse geometry to change a resistance of the active region.

21. The fuse of claim 20, wherein the middle portion of said fuse geometry is adapted to increase a current density of a current through an end portion of said fuse geometry sufficient for fuse programming.

22. The fuse of claim 20, wherein the middle portion is an active resistor structure.

23. The fuse of claim 20, wherein the active region includes a shallow doping layer.

24. The fuse of claim 20, wherein the active region includes deep implants.

25. The fuse of claim 20, further comprising:
sidewall spacers formed around the select gate.

26. The fuse of claim 20, further comprising:
a silicide formed over the select gate and portions of the fuse geometry.

27. The fuse of claim 26, wherein the silicide is an active silicide over the portions of said fuse geometry.

28. The fuse of claim 20, further comprising:
a contact formed proximate said select gate within an end portion of said fuse geometry.

29. The fuse of claim 28, wherein said contact includes multiple contact regions configured to handle a current flow sufficient to program said fuse.

30. The fuse of claim 20, further comprising:
a contact formed in contact with an end portion of said fuse geometry.

31. The fuse of claim 20, further comprising:
first and second contacts, said first contact contacting an end portion of said fuse geometry proximate the select gate and said second contact contacting an opposite end portion of the fuse geometry.

32. The fuse of claim 31, wherein one selected from the group consisting of said first and second contacts includes multiple contact regions configured to handle an increased current flow more than a current flow through a single contact.

33. The fuse of claim 20, wherein the active region includes one selected from the group consisting of an active region of a bulk silicon substrate and an active region of an SOI substrate.

34. The fuse of claim 20, wherein the middle portion of said fuse geometry has been programmed from a first resistance state to a second resistance state.

35. A fuse, comprising:

a fuse geometry formed in a portion of an active region, wherein said fuse geometry includes opposite end portions and a middle portion, wherein the middle portion includes an active resistor structure;

a select gate disposed over an end portion of said fuse geometry, wherein said select gate and an underlying portion of the end portion of said fuse geometry form an integral select transistor for use in programming said fuse;

a silicide formed over said select gate and portions of said fuse geometry; and first and second contacts, wherein said first contact contacts an end portion of said fuse geometry proximate said select gate and said second contact contacts an opposite end portion of said fuse geometry, wherein a programming current damages a portion of the silicide over the middle portion of the fuse geometry to change a resistance of the active resistor structure.

36. The fuse of claim 35, wherein the middle portion of said fuse geometry has been programmed from a first resistance state to a second resistance state.

37. An integrated circuit having a fuse, comprising:

a fuse geometry in a portion of an active region, wherein the fuse geometry includes opposite end portions and a middle portion;

a select gate disposed over an end portion of the fuse geometry, wherein the select gate and an underlying portion of the end portion of the fuse geometry form an integral select transistor for use in programming said fuse;

a silicide over the select gate and portions of the fuse geometry, wherein during programming, a current is driven from the select transistor through the middle portion of the fuse geometry that damages a portion of the silicide over the middle portion of the fuse geometry to change a resistance of the active region.

* * * * *